(12) United States Patent
Wang et al.

(10) Patent No.: US 9,508,808 B2
(45) Date of Patent: Nov. 29, 2016

(54) MANUFACTURING METHOD OF THIN FILM TRANSISTOR AND MANUFACTURING METHOD OF ARRAY SUBSTRATE

(71) Applicants: BOE TECHNOLOGY GROUP CO., LTD., Beijing (CN); BEIJING BOE DISPLAY TECHNOLOGY CO., LTD., Beijing (CN)

(72) Inventors: Shoukun Wang, Beijing (CN); Huibin Guo, Beijing (CN); Yuchun Feng, Beijing (CN); Xiaowei Liu, Beijing (CN); Zongjie Guo, Beijing (CN)

(73) Assignees: BOE Technology Group Co., Ltd., Beijing (CN); Beijing BOE Display Technology Co., Ltd, Beijing (CN)

( * ) Notice: Subject to any disclaimer, the term of this patent is extended or adjusted under 35 U.S.C. 154(b) by 0 days.

(21) Appl. No.: 14/406,892

(22) PCT Filed: Jun. 18, 2014

(86) PCT No.: PCT/CN2014/080236
§ 371 (c)(1),
(2) Date: Dec. 10, 2014

(87) PCT Pub. No.: WO2015/096416
PCT Pub. Date: Jul. 2, 2015

(65) Prior Publication Data
US 2015/0318362 A1 Nov. 5, 2015

(30) Foreign Application Priority Data
Dec. 27, 2013 (CN) .......................... 2013 1 0742756

(51) Int. Cl.
H01L 21/00 (2006.01)
H01L 27/00 (2006.01)
(Continued)

(52) U.S. Cl.
CPC ..... H01L 29/41733 (2013.01); H01L 21/0273 (2013.01); H01L 21/283 (2013.01);
(Continued)

(58) Field of Classification Search
CPC ............. H01L 21/0273; H01L 21/283; H01L 21/31111; H01L 21/32139; H01L 21/707; H01L 27/1222; H01L 27/1288; H01L 27/127; H01L 29/41733; H01L 29/66742; H01L 29/786
See application file for complete search history.

(56) References Cited

U.S. PATENT DOCUMENTS 7,977,175 B2    7/2011  Jung et al.
8,049,255 B2   11/2011  Sakai et al.
(Continued)

FOREIGN PATENT DOCUMENTS

CN     101097385 A    1/2008
CN     101320181 A   12/2008
(Continued)

OTHER PUBLICATIONS

International Search Report, International Preliminary Report on Patentability and Written Opinion of the International Searching Authority of PCT/CN2014/080236 in Chinese, mailed Jun. 18, 2014.
(Continued)

Primary Examiner — Nikolay Yushin
(74) Attorney, Agent, or Firm — Collard & Roe, P.C.

(57) ABSTRACT

A thin film transistor and manufacturing method thereof, an array substrate comprising the thin film transistor and manufacturing method thereof are provided. The method of manufacturing the thin film transistor comprises forming an active layer and a source-drain electrode layer, forming a photoresist layer on the source-drain electrode layer and forming a pattern of the photoresist layer by a pattern process; etching the source-drain electrode layer by using the pattern of the photoresist layer as a mask to form a pattern of the source-drain electrode layer including a source electrode and a drain electrode; and removing the photoresist, then etching the active layer by using the pattern of the source-drain electrode layer as a mask to form a pattern of the active layer.

14 Claims, 6 Drawing Sheets

(51) Int. Cl.
  *H01L 29/00*    (2006.01)
  *H01L 29/417*   (2006.01)
  *H01L 21/283*   (2006.01)
  *H01L 21/027*   (2006.01)
  *H01L 29/66*    (2006.01)
  *H01L 29/786*   (2006.01)
  *H01L 27/12*    (2006.01)

(52) U.S. Cl.
  CPC ..... *H01L 27/1222* (2013.01); *H01L 29/66742* (2013.01); *H01L 29/66765* (2013.01); *H01L 29/786* (2013.01); *H01L 27/1288* (2013.01)

(56) References Cited

U.S. PATENT DOCUMENTS

| | | | |
|---|---|---|---|
| 8,062,936 B2 | 11/2011 | Seo et al. | |
| 8,451,395 B2 | 5/2013 | Nagano et al. | |
| 8,633,043 B2 | 1/2014 | Cho et al. | |
| 2005/0083471 A1 | 4/2005 | Ono et al. | |
| 2012/0315715 A1* | 12/2012 | Cho | G02F 1/1368 438/30 |

FOREIGN PATENT DOCUMENTS

| | | |
|---|---|---|
| CN | 101788738 A | 7/2010 |
| CN | 101814455 A | 8/2010 |
| CN | 102819156 A | 12/2012 |
| CN | 103715096 A | 4/2014 |

OTHER PUBLICATIONS

Chinese Office Action of Chinese Application No. 201310742756.9, mailed Nov. 4, 2015 with English translation.
Second Chinese Office Action of Chinese Application No. 201310742756.9, mailed Apr. 5, 2016 with English translation.
Third Chinese Office Action of Chinese Application No. 201310742756.9, mailed May 27, 2016 with English translation.
English translation of the International Preliminary Report on Patentability and Written Opinion of the International Searching Authority of PCT/CN2014/080236, issued Jun. 28, 2016.
Fourth Chinese Office Action of Chinese Application No. 201310742756.9, mailed Jul. 29, 2016 with English translation.

* cited by examiner

MANUFACTURING METHOD OF THIN FILM TRANSISTOR AND MANUFACTURING METHOD OF ARRAY SUBSTRATE

CROSS REFERENCE TO RELATED APPLICATIONS

This application is the National Stage of PCT/CN2014/080236 filed on Jun. 18, 2014, which claims priority under 35 U.S.C. §119 of Chinese Application No. 201310742756.9 filed on Dec. 27, 2013, the disclosure of which is incorporated by reference.

TECHNICAL FIELD

Embodiments of the present invention relate to a thin film transistor and a manufacturing method thereof, an array substrate and a manufacturing method thereof.

BACKGROUND

Manufacture of amorphous-silicon thin film transistors-liquid crystal displays (TFT-LCD) usually employs back channel etch technique.

As shown in FIG. 1, a method for manufacturing the thin film transistors includes: forming a gate layer pattern including a gate electrode 2 on a substrate 1, forming a gate insulating layer 3, forming successively an active layer 4, a source-drain electrode layer 5 and a photoresist layer 6 on the gate insulating layer 3; wherein the active layer can include a semiconductor layer 41 and an ohmic contact layer (a doped semiconductor layer) 42 (as shown in FIG. 1).

The substrate coated with the photoresist layer 6 is exposed and developed by using a gray-tone or half-tone mask to form an unexposed region 61 of the photoresist, a partially exposed region 62 of the photoresist and a completely exposed region 63 of the photoresist, as shown in FIG. 2. A first etching process is performed, the source-drain electrode layer and the active layer in the completely exposed region of the photoresist are etched since there is no photoresist to protect them, as shown in FIG. 3. An ashing process is performed, the photoresist remained on the partially exposed region 62 of the photoresist is removed, the photoresist remained on the unexposed region 61 of the photoresist is thinned, as shown in FIG. 4. A second etching process is performed, the source-drain electrode layer in the partially exposed region of the photoresist is etched firstly, so as to form a source electrode 51 and a drain electrode 52; then a part of active layer 4 between the source electrode 51 and the drain electrode 52 is etched, and the doped semiconductor layer 42 in the active layer is completely etched, as shown in FIG. 5; finally, the photoresist is peeled off, as shown in FIG. 6.

SUMMARY

The embodiments of the present invention provide a thin film transistor and manufacturing method thereof, comprising an array substrate of the thin film transistor and manufacturing method thereof, which can prevent or decrease the possibility of the region of the active layer between the source electrode and the drain electrode being polluted by organics, thereby improve the performance of the thin film transistor.

At least one embodiment of the present invention provides a method of manufacturing a thin film transistor, and the method comprises:

forming an active layer and a source-drain electrode layer, forming a photoresist layer on the source-drain electrode layer and forming a pattern of the photoresist layer via a pattern process;

etching the source-drain electrode layer by using the pattern of the photoresist layer as a mask to form a pattern of the source-drain electrode layer including a source electrode and a drain electrode;

removing the photoresist, then etching the active layer by using the pattern of the source-drain electrode layer as a mask to form a pattern of the active layer.

For example, the photoresist layer comprises positive photoresist.

The pattern process comprises using a gray mask or a half-tone mask to expose and develop the substrate coated with the photoresist layer; then forming an unexposed region of the photoresist, a partially exposed region of the photoresist and a completely exposed region of the photoresist.

For example, the method further comprises:

performing a first etching process so that the source-drain electrode layer and the active layer in the completely exposed region of the photoresist are etched; performing an ashing process so that the photoresist remained on the partially exposed region of the photoresist is removed and the photoresist remained on the unexposed region of the photoresist is thinned; and performing a second etching process to firstly etch the source-drain electrode layer in the partially exposed region of the photoresist, so as to form a source electrode and a drain electrode.

For example, a wet etching process is used to etch the source-drain electrode layer.

For example, a dry etching process is used to etch the active layer.

For example, the dry etching process is using chemical gas plasma to bombard the active layer.

For example, the active layer comprises a semiconductor active layer and an ohmic contact layer.

The etching of the active layer comprises etching the ohmic contact layer between the source electrode and the drain electrode.

The manufacturing method further comprises:

forming a gate layer, forming a pattern of the gate layer comprising a gate electrode by a pattern process; and forming a gate insulating layer.

At least one embodiment of the present invention provides a thin film transistor manufactured by above manufacturing method, which comprises a gate electrode, a gate insulating layer, an active layer, a source electrode and a drain electrode.

At least one embodiment of the present invention provides an array substrate, which comprises the above thin film transistor.

At least one embodiment of the present invention provides a method for manufacturing the above array substrate, the manufacturing method comprises:

forming a gate layer, forming a pattern of the gate layer comprising a gate electrode and a gate line by a pattern process;

forming a gate insulating layer;

forming an active layer and a source-drain electrode layer, forming a photoresist layer on the source-drain electrode layer, and forming a pattern of the photoresist layer by a pattern process, etching the source-drain electrode layer by using the pattern of the photoresist layer as a mask to form a pattern of the source-drain electrode layer comprising a source electrode, a drain electrode and a data line, and removing the photoresist;

forming a pixel electrode layer, and forming a pattern of the pixel electrode layer comprising a pixel electrode by a pattern process, wherein the pixel electrode is directly contact connection with the drain; and etching the active layer by using the pattern of the source-drain electrode layer as a mask to form a pattern of the active layer.

BRIEF DESCRIPTION OF THE DRAWINGS

Embodiments of the present invention will be described in detail hereinafter in conjunction with accompanying drawings to allow one of ordinary skill in the art to understand the present invention more clearly, in which.

DETAILED DESCRIPTION

Technical details and advantages of the embodiments of the invention apparent, technical solutions according to the embodiments of the present invention will be described clearly and completely as below in conjunction with the accompanying drawings of embodiments of the present invention. It is to be understood that the described embodiments are only a part of but not all of exemplary embodiments of the present invention. Based on the described embodiments of the present invention, various other embodiments can be obtained by those of ordinary skill in the art without creative labor and those embodiments shall fall into the protection scope of the present invention.

Unless otherwise defined, all the technical and scientific terms used herein have the same meanings as commonly understood by one of ordinary skill in the art to which the present invention belongs. The terms, such as "first," "second," or the like, which are used in the description and the claims of the present application, are not intended to indicate any sequence, amount or importance, but for distinguishing various components. Also, the terms, such as "a/an," "one," or the like, are not intended to limit the amount, but for indicating the existence of at least one. The terms, such as "comprise/comprising," "include/including," or the like are intended to specify that the elements or the objects stated before these terms encompass the elements or the objects and equivalents thereof listed after these terms, but not preclude other elements or objects. The terms, "on," "under," or the like are only used to indicate relative position relationship, and when the position of the object which is described is changed, the relative position relationship may be changed accordingly.

In a pattern process that forms a pattern of a source electrode and a drain electrode and an active layer, usually, an exposure and a development are performed after a photoresist is coated, and the source-drain electrode layer and the active layer are etched by using the pattern of the photoresist as a mask to form the required pattern. In the procedure of etching, since organics or substances in the photoresist would be bombarded and diffused into the active layer between the source electrode and the drain electrode in the thin film transistor, the active layer membranous of this region is polluted by the organics and the other substances, which leads to decreasing the performance of the thin film transistor.

Figure 7:
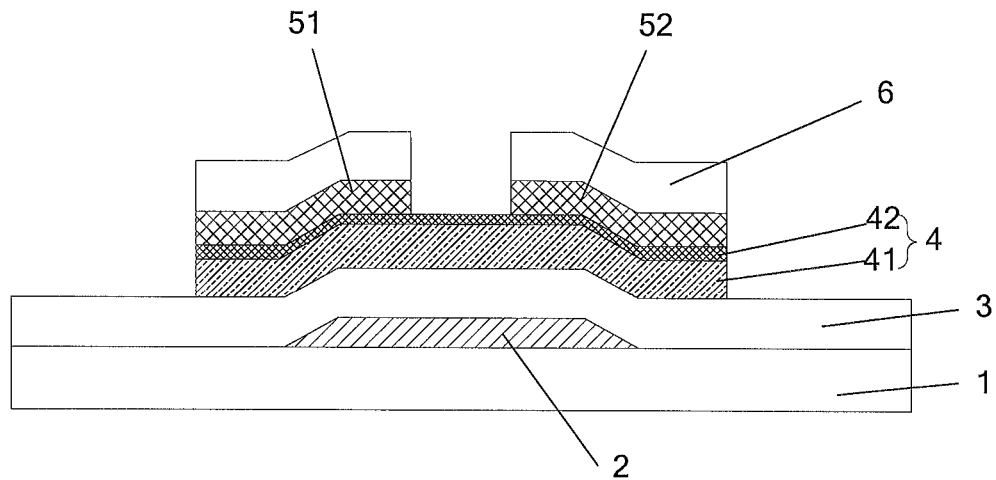
FIG. 7 is a first schematic structural view of a device in the process of manufacturing a TFT according to an embodiment of the present invention.
Figure 8:
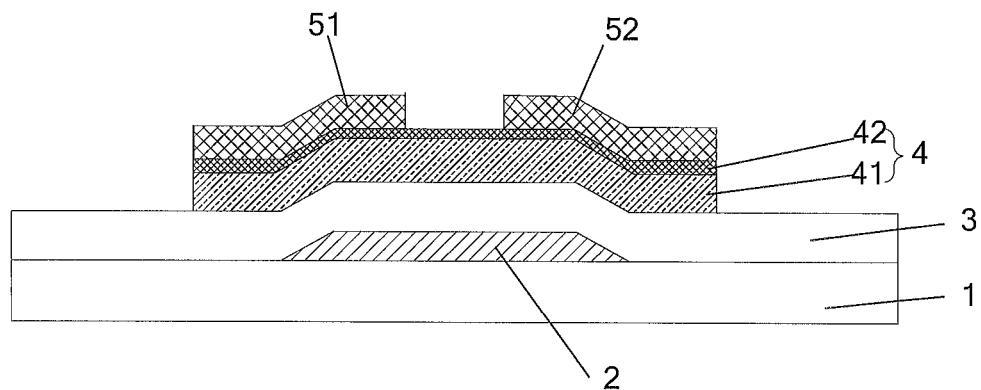
FIG. 8 is a second schematic structural view of the device in the process of manufacturing the TFT according to an embodiment of the present invention.
Figure 9:
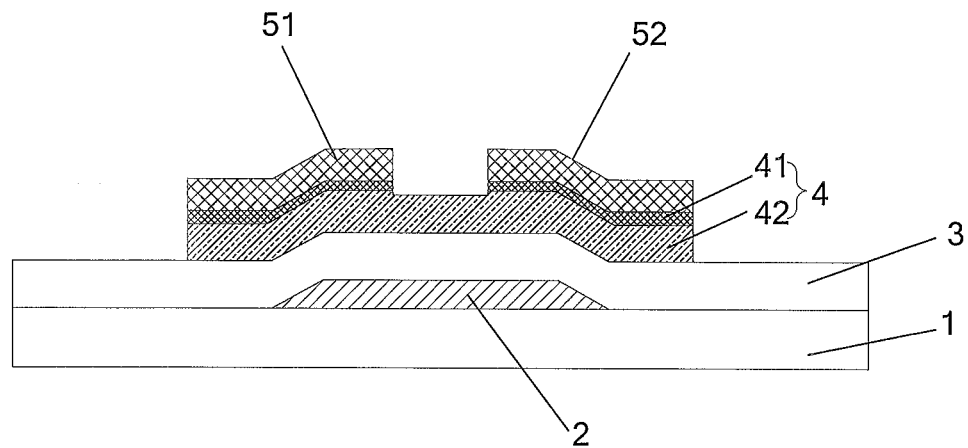
FIG. 9 is a third schematic structural view of the device in the process of manufacturing the TFT according to an embodiment of the present invention.
Figure 10:
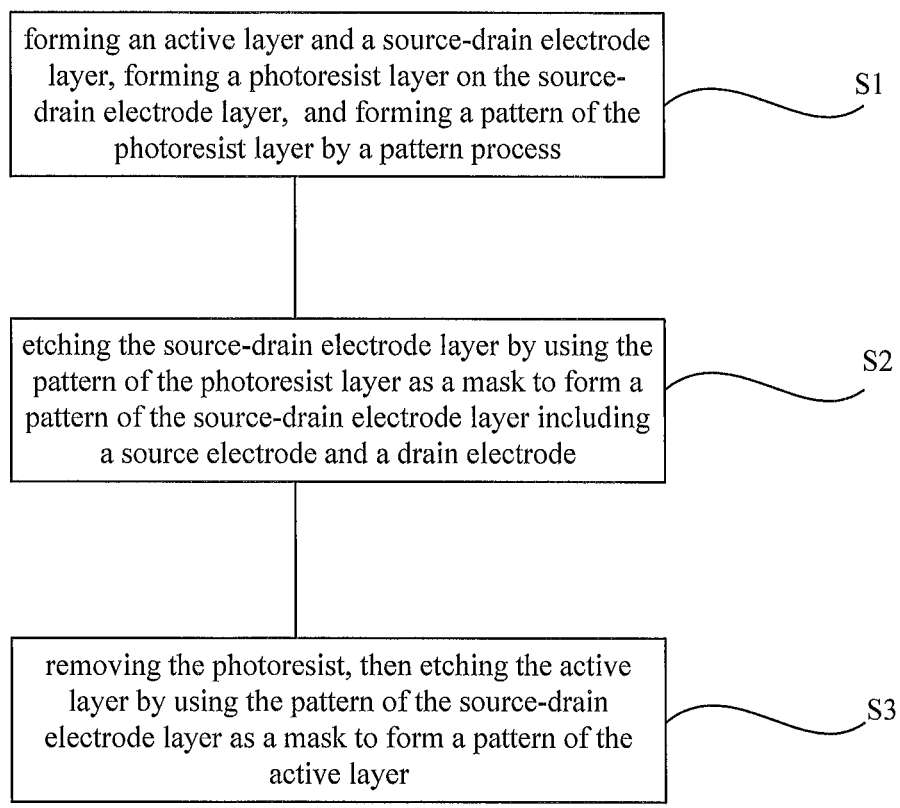
FIG. 10 is a flow chart of manufacturing the TFT according to an embodiment of the present invention.

Referring to FIGS. 7-9 combined with FIG. 10, embodiments of the present invention provide a method of manufacturing a thin film transistor (TFT), and the manufacturing method comprises the following steps.

S1: an active layer 4 and a source-drain electrode layer 5 are formed, a photoresist layer 6 is formed on the source-drain electrode layer 5, and a pattern of the photoresist layer is formed by a pattern process.

For example, the photoresist layer is a positive photoresist.

In the process of manufacturing the thin film transistor, a gate layer 2 and the source-drain electrode layer 5 are made of conductive material, such as metals; the active layer 4 is made of an amorphous-silicon (a-Si). The gate layer 2 and the source-drain electrode layer 5 can be formed by using a magnetron sputtering method. The active layer 4 can be formed by using a chemical vapor deposition method. In this step, the photoresist layer 6 is a positive photoresist. The pattern process comprises using a gray mask or a half-tone mask to exposure and develop the substrate coated with the photoresist layer; then an unexposed region of the photoresist, a partially exposed region of the photoresist and a completely exposed region of the photoresist are formed.

S2: The source-drain electrode layer 5 is etched by using the pattern of the photoresist layer 6 as a mask to form a pattern of the source-drain electrode layer 5 comprising a source electrode 51 and a drain electrode 52.

For example, the wet etching process is used in the etching process.

For example, the etching process comprises the following steps: A first etching process is performed, the source-drain electrode layer and the active layer in the completely exposed region of the photoresist are etched since there is no photoresist to protect them; an ashing process is performed, the photoresist remained on the partially exposed region of the photoresist is removed, and the photoresist remained on the unexposed region of the photoresist is thinned; and a second etching process is performed, the source-drain electrode layer in the partially exposed region of the photoresist is etched firstly, so as to form the source electrode 51 and the drain electrode 52.

S3: the photoresist 6 is removed, as shown in FIG. 8; then the active layer 4 is etched by using the pattern of the source-drain electrode layer as a mask to form a pattern of the active layer 4, as shown in FIG. 9.

For example, in this step, a dry etching process is used to etch the active layer. The dry etching process is such a process that vacuum gas is used to produce gas plasma under effect of radio-frequency power to make a reaction, thereby to produce atoms and atom groups, and the atoms and atom groups react with the substances deposited on the substrate to produce volatile substances, thereby to achieve purpose of dry etching some substance. Furthermore, the dry etching process is a process of using chemical gas plasma to bombard the active layer. Since the chemical gas used in the dry etching process only etch non-metal film layer and cannot etch a metal layer, etching precision is guaranteed.

In the step S3: the active layer 4 comprises a semiconductor layer 41 and an ohmic contact layer 42. The ohmic contact layer 42 between the source electrode and the drain electrode need to be completely etched off, but the semiconductor layer (the amorphous-silicon layer) does not need to be etched theoretically. However, in an actual process, for ensuring that the ohmic contact layer 42 between the source electrode and the drain electrode is completely etched off so that the thin film transistor is formed, the semiconductor layer may be partially etched. Therefore, the step of etching the active layer comprises etching off the ohmic contact layer 42 between the source electrode 51 and the drain electrode 52.

In the above method of manufacturing the thin film transistor, the active layer is etched by using the pattern of the source-drain electrode layer as a mask to form a pattern of the active layer after the photoresist is removed. The chemical gas plasma is used to bombard the region of the active layer between the source electrode and the drain electrode, thereby to etch the active layer. In the etching process, since the photoresist material is removed, which avoids the problem that the photoresist material is bombarded and diffused into the region of the active layer 4 between the source electrode and the drain electrode, thereby avoids affecting the performance of the thin film transistor. It can be seen that the method of manufacturing the thin film transistor prevents or decreases the possibility of the region of the active layer between the source electrode and the drain electrode being polluted by organics, thereby the performance of the thin film transistor is improved.

Further, the manufacturing method further comprises the following steps before the step S1.

As shown in FIGS. 7-9, a gate layer 2 is formed on the substrate 1, a pattern of the gate layer including a gate electrode 2 is formed by a pattern process; and a gate insulating layer 3 is formed. The pattern process comprises coating photoresist, exposure, development, etching and removing the photoresist.

The embodiment of the present invention further provides a thin film transistor comprising: a gate electrode, a gate insulating layer, an active layer, a source electrode and a drain electrode. The thin film transistor is manufactured by the above manufacturing method.

The embodiment of the present invention further provides an array substrate comprising the above thin film transistor.

The embodiment of the present invention further provides a method of manufacturing array substrates, which can solve the problem of the region of the active layer between the source electrode and the drain electrode being polluted.

An ADS (Advanced Super Dimension Switch) liquid crystal panel is a mode that uses transverse electric field produced by electrodes in a same plane to deflect liquid crystal molecules to achieve image display. This technology can improve aperture ratio and transmittance of the liquid crystal display panel. A transparent pixel electrode layer is arranged on a source-drain electrode layer of an array substrate in the ADS liquid crystal display panel; a pixel electrode directly contacts with the drain electrode of a thin film transistor of the array substrate rather than connects with the drain electrode by a via hole in a passivation layer. The array substrate of the ADS liquid crystal display panel further comprises a common electrode layer. The common electrode layer can be arranged under the pixel electrode layer or above the pixel electrode layer. The common electrode layer and the pixel electrode layer are usually made of transparent conductive material, such as indium tin oxide (ITO). In the process of manufacturing the array substrate in the ADS liquid crystal display, the pixel electrode layer is formed after the source-drain electrode layer is formed; then the patterns of the pixel electrode layer, the source-drain electrode layer and the active layer are formed by a pattern process. In the process of manufacturing each pattern, there is also a problem of the region of the active layer between the source electrode and the drain electrode being polluted, because the pixel electrode layer material, such as ITO, can be bombarded on the region of the active layer between the source electrode and the drain electrode.

Figure 1:
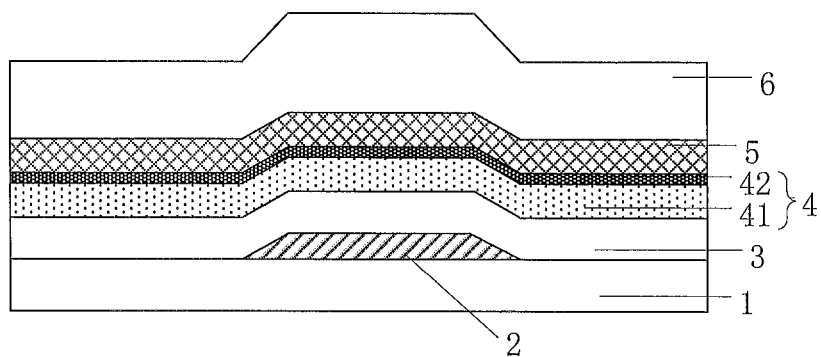
FIG. 1 is a first schematic structural view of a device in the process of manufacturing a TFT.
Figure 2:
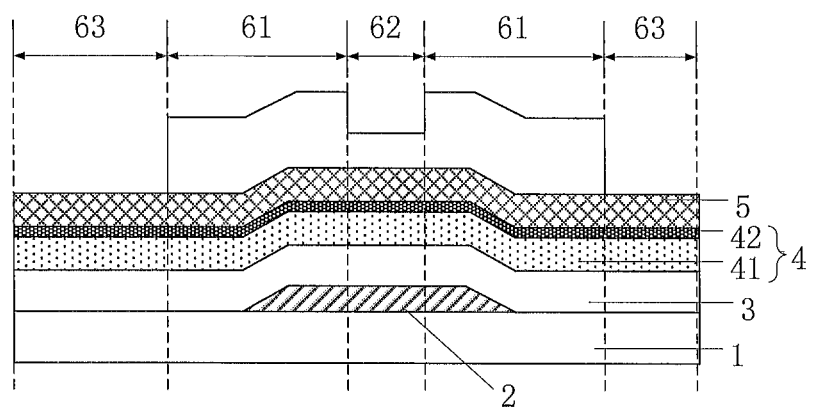
FIG. 2 is a second schematic structural view of the device in the process of manufacturing the TFT.
Figure 3:
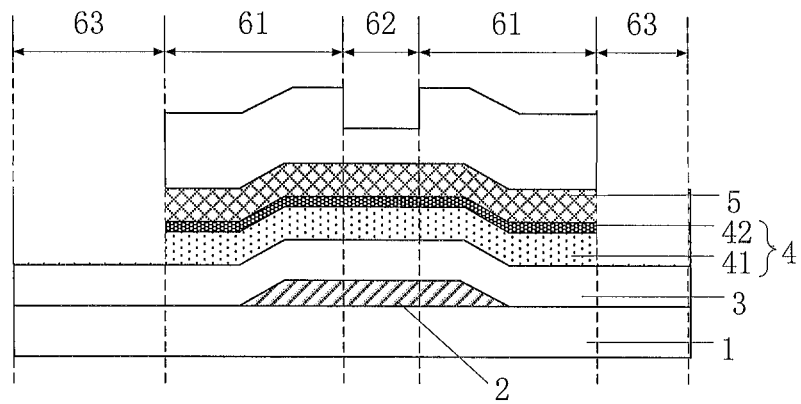
FIG. 3 is a third schematic structural view of the device in the process of manufacturing the TFT.
Figure 4:
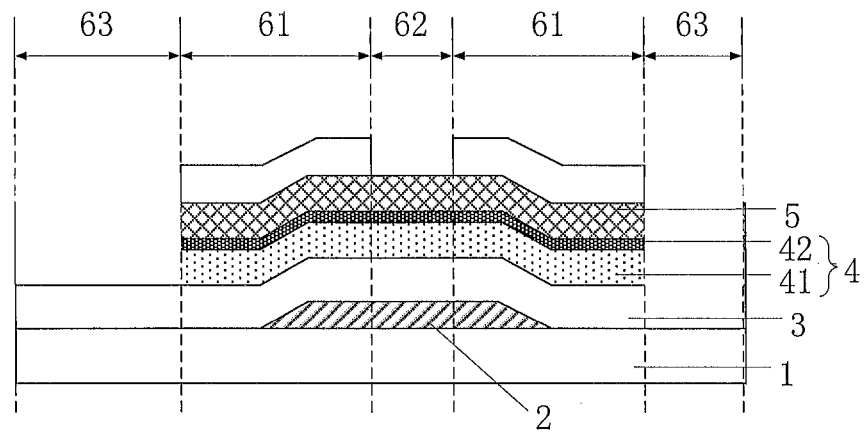
FIG. 4 is a fourth schematic structural view of the device in the process of manufacturing the TFT.
Figure 5:
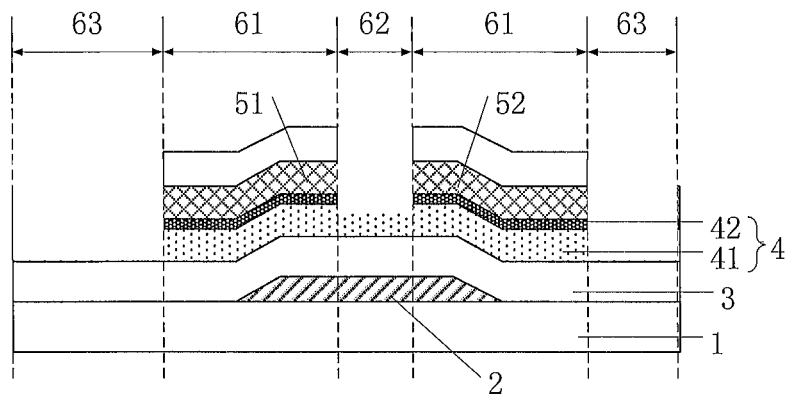
FIG. 5 is a fifth schematic structural view of the device in the process of manufacturing the TFT.
Figure 6:
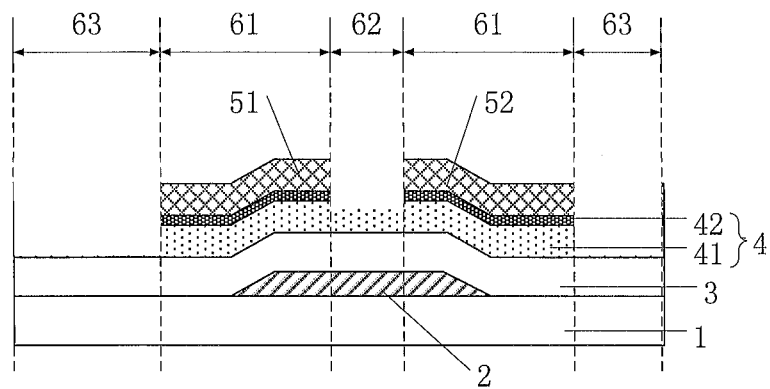
FIG. 6 is a sixth schematic structural view of the device in the process of manufacturing the TFT.
Figure 11:
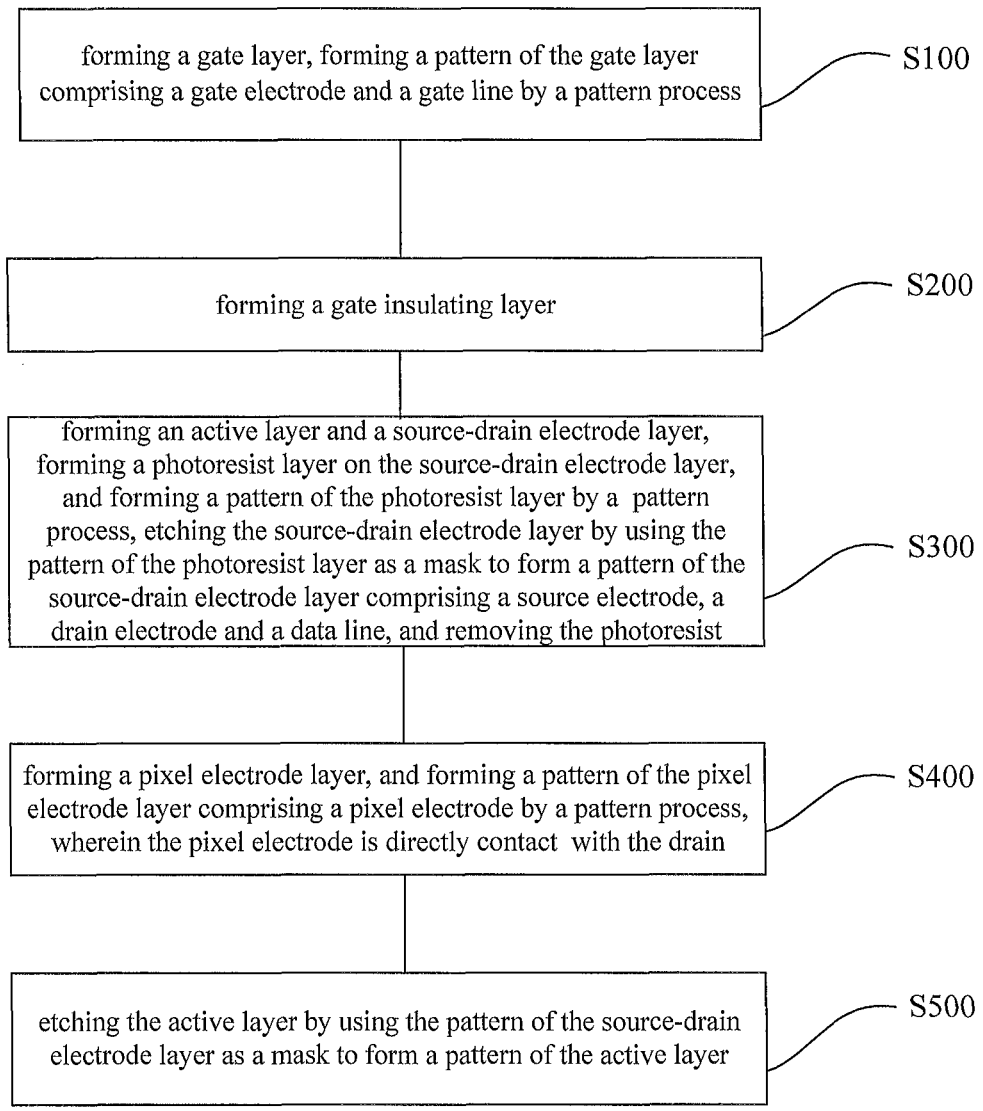
FIG. 11 is a flow chart of manufacturing an array substrate according an embodiment of the present invention.

The method of manufacturing the array substrate according to embodiments of the present invention can effectively solve the problem of the region of the active layer between the source electrode and the drain electrode being polluted. As shown in FIG. 11 and combined with FIGS. 12 and 1, the method of manufacturing the array substrate according to an embodiment of the present invention comprises the following steps.

S100: a gate layer 2 is formed, a pattern of a gate layer comprising a gate electrode 21 and a gate line 23 is formed by a pattern process.

The pattern process comprises: coating photoresist on the gate layer 2, exposure, development, etching the gate layer 2, and removing the photoresist.

S200: a gate insulating layer 3 is formed.

S300: an active layer 4 and a source-drain electrode layer 5 are formed; a photoresist layer 6 is formed on the source-drain electrode layer 5, and a pattern of the photoresist layer is formed by a pattern process; the source-drain electrode layer 5 is etched by using the pattern of the photoresist layer as a mask to form a pattern of the source-drain electrode layer comprising a source electrode 51, a drain electrode 52 and a data line 55; and the photoresist is removed.

S400: a pixel electrode layer 7 is formed; and a pattern of the pixel electrode layer comprising a pixel electrode 71 is formed by a pattern process; wherein the pixel electrode 71 is directly contact with the drain electrode 52.

The pattern process comprises coating photoresist on the pixel electrode layer 7, exposure, development, etching the pixel electrode layer and removing the photoresist.

S500: The active layer 4 is etched by using the pattern of the source-drain electrode layer 5 as a mask to form a pattern of the active layer.

In the above method of manufacturing the array substrate, the pixel electrode layer is not formed and the patterns of the pixel electrode layer, the source-drain electrode layer and the active layer are not formed by a pattern process after the source-drain electrode layer is formed, rather, in the step S300, the source-drain electrode layer 5 is etched to form the pattern of the source-drain electrode layer comprising the source electrode 51, the drain 52 and the data line 55 and then the photoresist is removed; the pattern of the pixel electrode layer 7 comprising pixel electrode 71 is formed on the surface of the source-drain electrode layer 5; then, the active layer 4 is etched by using the pattern of the source-drain electrode layer 5 as a mask to form the pattern of the active layer 4. In this manufacturing process, if the ITO material of the pixel electrode layer 7 or organic material of the photoresist are bombarded onto the region of the active layer between the source electrode 51 and the drain electrode 52 in the process of forming the pixel electrode layer 7, in the following step 500 of etching the active layer by using the pattern of the source-drain electrode layer as a mask, the active layer between the source electrode and the drain electrode that is penetrated by the ITO material or organic material can be etched off, which avoids the active layer being polluted by the ITO material or organic material, thereby ensuring the electrical performance of the thin film transistor.

Figure 12:
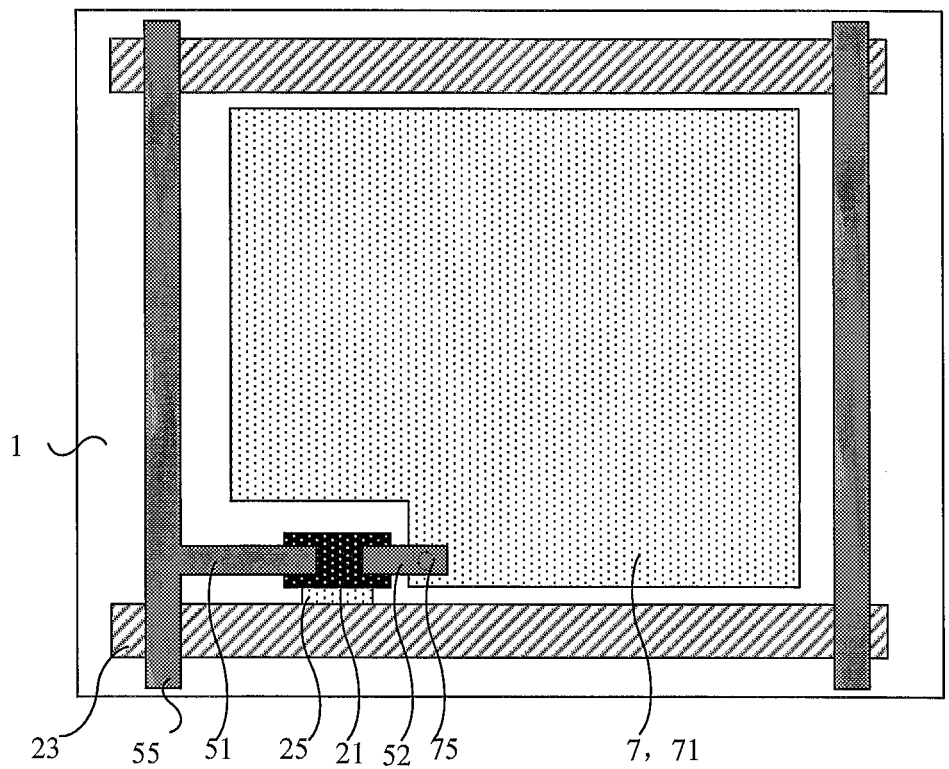
FIG. 12 is a structural schematic view of the array substrate formed according to an embodiment of the present invention.

As shown in FIG. 12, according to the embodiment of the present invention, the method further comprises steps of forming a gate via hole 25 and a pixel via hole 75.

The gate line 23 connects with the gate electrode 2 through the gate via hole 25. The pixel electrode 71 directly contacts with the drain electrode 52 of the thin film transistor in the array substrate 1 by the pixel via hole 75.

In the embodiments of the present invention, the active layer is etched by using the pattern of the source and drain as a mask to form the pattern of the active layer, which can purposely prevent or decrease the possibility of the region of the active layer between the source electrode and the drain electrode being polluted by organics, thereby improves the electrical performance of the thin film transistor.

The method of manufacturing the array substrate provided by embodiments of the present invention decreases or prevents the possibility of the region of the active layer between the source electrode and the drain electrode in the thin film transistor being polluted by organics, thereby improves the electrical performance of the thin film transistor in the array substrate.

It is understood that the described above are only illustrative embodiments and implementations for explaining the present invention, and the present invention is not intended to limited thereto. For one of ordinary skill in the art, various modifications and improvements may be made without departing from the spirit and scope of embodiments of the present invention, and all of which should fall within the protection scope of the present invention. The scope protected by the present invention is defined by the claims.

The present invention claims priority of Chinese patent application No. 201310742756.9 filed on Dec. 27, 2013 entitled "thin film transistor and manufacturing method thereof, array substrate and manufacturing method thereof", the entire contents of which are incorporated herein by reference.

What is claimed is:

1. A method of manufacturing a thin film transistor of an Advanced Super Dimension Switch (ADS) liquid crystal panel, comprising: forming an active layer and a source-drain electrode layer, forming a photoresist layer on the source-drain electrode layer, and forming a pattern of the photoresist layer by a pattern process; etching the source-drain electrode layer by using the pattern of the photoresist layer as a mask to form a pattern of the source-drain electrode layer including a source electrode and a drain electrode; and removing the photoresist, then bombarding the active layer by using chemical gas plasma, and using the pattern of the source-drain electrode layer as a mask to form a pattern of the active layer.

2. The method of manufacturing the thin film transistor according to claim 1, wherein a wet etching process is used to etch the source-drain electrode layer.

3. The method of manufacturing the thin film transistor according to claim 1, further comprising:
   forming a gate layer, forming a pattern of the gate layer comprising a gate electrode by a pattern process; and
   forming a gate insulating layer.

4. The method of manufacturing the thin film transistor according to claim 1, wherein the pattern process comprises using a gray mask or a half-tone mask to expose and develop the substrate coated with the photoresist layer to form an unexposed region of the photoresist, a partially exposed region of the photoresist and a completely exposed region of the photoresist.

5. The method of manufacturing the thin film transistor according to claim 1, wherein the active layer comprises a semiconductor active layer and an ohmic contact layer arranged between the semiconductor active layer and the source-drain electrode layer.

6. The method of manufacturing the thin film transistor according to claim 5, further comprising etching off the ohmic contact layer between the source electrode and the drain electrode.

7. The method of manufacturing the thin film transistor according to claim 1, wherein the photoresist layer comprises positive photoresist.

8. The method of manufacturing the thin film transistor according to claim 7, wherein the pattern process comprises using a gray mask or a half-tone mask to expose and develop the substrate coated with the photoresist layer to form an unexposed region of the photoresist, a partially exposed region of the photoresist and a completely exposed region of the photoresist.

9. The method of manufacturing the thin film transistor according to claim 8, further comprising:
   performing a first etching process to etch the source-drain electrode layer and the active layer in the completely exposed region of the photoresist; performing an asking process to remove the photoresist remained on the partially exposed region of the photoresist and thin the photoresist remained on the unexposed region of the photoresist; and
   performing a second etching process to etch the source-drain electrode layer in the partially exposed region of the photoresist to form a source electrode and a drain electrode.

10. The method of manufacturing the thin film transistor according to claim 9, wherein a wet etching process is used to etch the source-drain electrode layer.

11. The method of manufacturing the thin film transistor according to claim 10, wherein the active layer comprises a semiconductor active layer and an ohmic contact layer arranged between the semiconductor active layer and the source-drain electrode layer.

12. The method of manufacturing the thin film transistor according to claim 11, further comprising etching off the ohmic contact layer between the source electrode and the drain electrode.

13. The method of manufacturing the thin film transistor according to claim 12, further comprising:
   forming a gate layer, forming a pattern of the gate layer comprising a gate electrode by a pattern process; and
   forming a gate insulating layer.

14. A method of manufacturing the array substrate of an Advanced Super Dimension Switch (ADS) liquid crystal panel, comprising: forming a gate layer, forming a pattern of the gate layer comprising a gate electrode and a gate line by a pattern process; forming a gate insulating layer; forming an active layer and a source-drain electrode layer, forming a photoresist layer on the source-drain electrode layer, and forming a pattern of the photoresist layer by a pattern process, etching the source-drain electrode layer by using the pattern of the photoresist layer as a mask to form a pattern of the source-drain electrode layer comprising a source electrode, a drain electrode and a data line, and removing the photoresist; forming a pixel electrode layer, and forming a pattern of the pixel electrode layer comprising a pixel electrode by a pattern process, wherein the pixel electrode is directly contact with the drain electrode; and bombarding the active layer by using chemical gas plasma, and using the pattern of the source-drain electrode layer as a mask to form a pattern of the active layer.

\* \* \* \* \*